United States Patent
Xin et al.

(10) Patent No.: US 12,520,616 B2
(45) Date of Patent: Jan. 6, 2026

(54) PHOTODIODE AND METHOD FOR MANUFACTURING THE SAME

(71) Applicant: TIANJIN SANAN OPTOELECTRONICS CO., LTD., Tianjin (CN)

(72) Inventors: Xiufeng Xin, Tianjin (CN); Minghui Song, Tianjin (CN); Yuanyuan Wang, Tianjin (CN); Hongwei Zhao, Tianjin (CN); Wenjun Chen, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 1 day.

(21) Appl. No.: 18/522,951

(22) Filed: Nov. 29, 2023

(65) Prior Publication Data

US 2024/0186435 A1 Jun. 6, 2024

(30) Foreign Application Priority Data

Dec. 1, 2022 (CN) .......................... 202211533423.0

(51) Int. Cl.
*H10F 77/14* (2025.01)
*H10F 71/00* (2025.01)

(52) U.S. Cl.
CPC ......... *H10F 77/148* (2025.01); *H10F 71/128* (2025.01); *H10F 71/129* (2025.01)

(58) Field of Classification Search
CPC .... H10F 30/223; H10F 71/128; H10F 71/129; H10F 77/14; H10F 77/148; H10F 77/306
See application file for complete search history.

(56) References Cited

U.S. PATENT DOCUMENTS

| | | | | |
|---|---|---|---|---|
| 4,009,058 | A * | 2/1977 | Mills | H01L 21/2253 438/560 |
| 5,045,908 | A * | 9/1991 | Lebby | H10F 77/413 257/466 |
| 5,185,272 | A * | 2/1993 | Makiuchi | H10F 30/223 257/E27.128 |
| 9,711,550 | B2 * | 7/2017 | Favennec | H10F 39/807 |
| 2002/0000510 | A1 * | 1/2002 | Matsuda | H10F 30/223 250/214.1 |
| 2003/0160248 | A1 * | 8/2003 | Yamaguchi | H10F 30/223 257/E27.129 |

(Continued)

*Primary Examiner* — Golam Mowla
(74) *Attorney, Agent, or Firm* — Muncy, Geissler, Olds & Lowe, P.C.

(57) ABSTRACT

A photodiode includes a substrate, a device structure, a barrier ring region, a photosensitive region, an oxide ring, and an oxide layer. The substrate has a first surface and a second surface opposite to the first surface. The device structure includes an N-type doped region, a non-doped intrinsic layer, and a P-type doped region. The barrier ring region is disposed in the substrate at a periphery of an upper portion of the substrate and is spaced apart from the P-type doped region. The photosensitive region is located above the P-type doped region. The oxide ring is disposed on the substrate and surrounds the photosensitive region. The oxide layer is disposed between the oxide ring and the second surface. The P-type doped region includes a deep doped region and a shallow doped region that are adjacent to each other. A method for manufacturing the photodiode is also provided.

12 Claims, 2 Drawing Sheets

(56) References Cited

U.S. PATENT DOCUMENTS

| | | | | |
|---|---|---|---|---|
| 2003/0168709 A1* | 9/2003 | Kashiura | ............... | H10F 39/18 |
| | | | | 257/458 |
| 2004/0075154 A1* | 4/2004 | Nakaji | ................ | H10F 30/223 |
| | | | | 257/458 |
| 2004/0108516 A1* | 6/2004 | Kang | .................. | H10F 77/241 |
| | | | | 257/184 |
| 2005/0139753 A1* | 6/2005 | Park | .................... | H10F 77/306 |
| | | | | 250/214.1 |
| 2005/0167709 A1* | 8/2005 | Augusto | ............... | H10F 39/18 |
| | | | | 257/292 |
| 2006/0060933 A1* | 3/2006 | Gao | ..................... | H10F 30/223 |
| | | | | 257/458 |
| 2009/0016200 A1* | 1/2009 | Tomomatsu | ......... | H10F 39/024 |
| | | | | 369/120 |
| 2010/0012974 A1* | 1/2010 | Shih | .................. | H10F 30/2235 |
| | | | | 438/69 |
| 2010/0019293 A1* | 1/2010 | Tomomatsu | ........... | H10F 71/00 |
| | | | | 438/59 |
| 2021/0111201 A1* | 4/2021 | Li | ........................ | H10F 39/18 |
| 2024/0186435 A1* | 6/2024 | Xin | ....................... | H10F 77/14 |

\* cited by examiner

PHOTODIODE AND METHOD FOR MANUFACTURING THE SAME

CROSS-REFERENCE TO RELATED APPLICATION

This application claims priority to Chinese Invention Patent Application No. 202211533423.0, filed on Dec. 1, 2022, and is incorporated by reference herein in its entirety.

FIELD

The disclosure relates to a semiconductor electronic device, and more particularly to a photodiode and a method for manufacturing the same.

BACKGROUND

In an optical coupler (also known as an opto-isolator), a photodiode is mainly used to receive light signals and convert the light signal into a current or voltage signal according to an application manner, and may be used as a photodetector. The photodiode has a specific wavelength spectrum. In recent years, with the widening applications of the optical coupler, a demand for a short wavelength response in the photodiode has been gradually increasing.

Currently, a primary method of improving the short wavelength (mainly referring to a spectrum within blue and green wavelengths) response in the photodiode is to create a shallow diffusion junction. However, the shallow junction and a fusion bonding may lead to a reduction in a breakdown voltage of the photodiode, thus limiting an efficiency of improving the short wavelength response in the photodiode. Furthermore, surface recombination may also restrict an improvement in the short wavelength response in the photodiode. With the expansion of the photodiode application landscape, requirements for a signal-to-noise ratio (SNR) of the photodiode at high temperature is gradually elevated.

Therefore, improving a short wavelength response and enhancing a light response intensity, while also meeting the elevated signal-to-noise ratio requirements at high temperature in the photodiode so as to enhance an optoelectronic performance of the photodiode is one of challenges that needs to be addressed.

SUMMARY

Therefore, an object of the disclosure is to provide a photodiode and a method for manufacturing the same that can alleviate at least one of the drawbacks of the prior art.

According to one aspect of the disclosure, the photodiode includes a substrate, a device structure, a barrier ring region, a photosensitive region, an oxide ring, and an oxide layer. The substrate has a first surface and a second surface opposite to the first surface. The device structure is provided between the first surface and the second surface and includes an N-type doped region adjacent to the first surface, a non-doped intrinsic layer, and a P-type doped region adjacent to the second surface. The barrier ring region is disposed in the substrate at a periphery of an upper portion of the substrate and is spaced apart from the P-type doped region. An upper surface of the barrier ring region is flush with the second surface. The photosensitive region is located above the P-type doped region. The oxide ring is disposed on the substrate and surrounds the photosensitive region. The oxide layer is disposed between the oxide ring and the second surface. The P-type doped region includes a deep doped region and a shallow doped region that are adjacent to each other. The deep doped region and the shallow doped region is aligned with the photosensitive region.

According to another aspect of the disclosure, the method for manufacturing the photodiode which has a photosensitive region includes the following steps: providing a substrate that has a first surface and a second surface opposite to the first surface; doping the substrate which includes doping a first portion of the substrate, which is adjacent to the second surface, to form a deep doped region and a shallow doped region that are adjacent to each other, doping a second portion of the substrate, which is adjacent to the second surface and is spaced apart from the first portion, to form a barrier ring region, and doping a third portion of the substrate, which is adjacent to the first surface, to form a heavily doped region and a lightly doped region; forming a dielectric layer on the second surface of the substrate, the dielectric layer being corresponding in position to the photosensitive region; forming a first electrode on the first surface; and forming a second electrode on the second surface, the second electrode being corresponding in position to the photosensitive region and being connected to the deep doped region.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
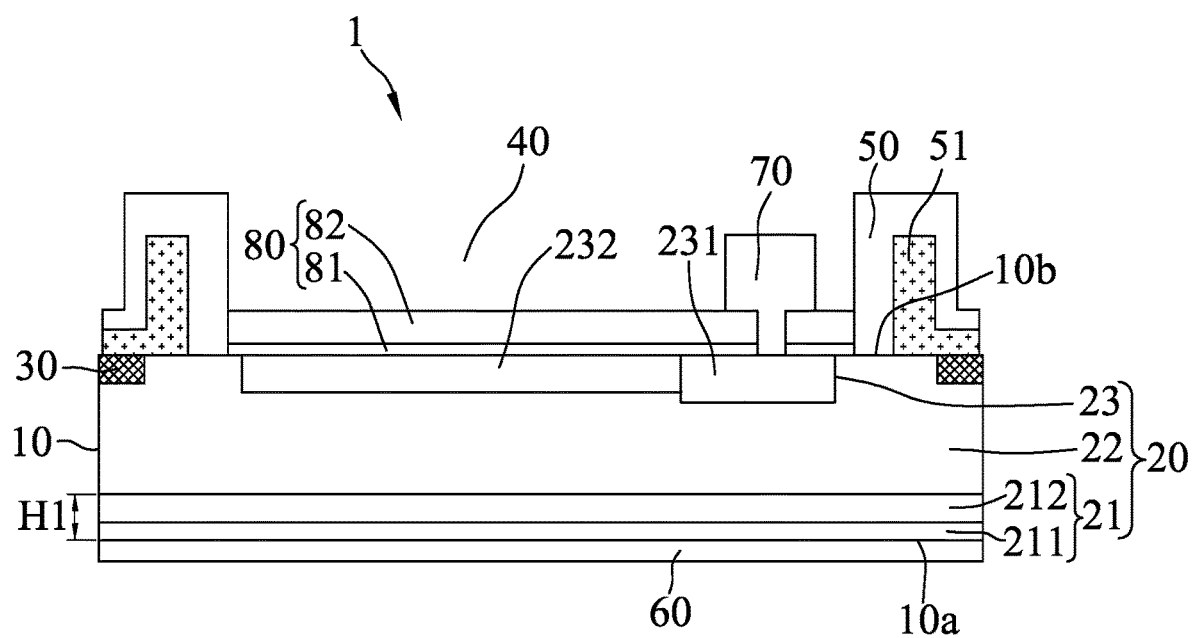
FIG. 1 is a cross-sectional schematic view illustrating an embodiment of a photodiode according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "center," "lateral," "top," "bottom," "upper," "lower," "on," "above," "over," "downwardly," "upwardly," "horizontal," "vertical," "left," "right," "inside," "outside" and the like may be used throughout the disclosure while making reference to the features as illustrated in the drawings. The features may be oriented differently (e.g., rotated 90 degrees or at other orientations) and the spatially relative terms used herein may be interpreted accordingly. Furthermore, the terms "first," "second," and other ordinal numbers used in connection with technical features are solely for descriptive purposes, and should not be understood as indicating or implying relative importance of the technical features or implying the quantity of the technical features. The quantity of any such technical feature may be one or more than one. In the description of the present invention, unless otherwise specified, the term "a" or "an" means at least one; the term "multiple," "plural," or "a plurality of" means two or more. Additionally, the phrase "comprising a technical feature" and its variations mean "including at least such technical feature," and does not rule out the possibility of including other technical features.

In the description of the present disclosure, it should also be noted that, unless otherwise specified or explicitly stated, the terms "disposed," "installed," "mounted," "connected," "coupled" and the like should be understood in a broad sense. For example, a "connection" may be a fixed connection, but it may also be a detachable connection or an integral connection; it may be a mechanical connection or an electrical connection; it may be a direct connection or an indirect connection achieved through an intermediary, or it may refer to internal communication of two components. The above terms as used in the present disclosure are intended to be understandable to one of ordinary skill in the art under the specific situations as described in the disclosure.

Referring to FIG. 1, an embodiment of a photodiode 1 according to this disclosure includes a substrate 10, a device structure 20, a barrier ring region 30, a photosensitive region 40, an oxide ring 50, and an oxide layer 51. The substrate 10 has a first surface 10a and a second surface 10b opposite to the first surface 10a. The device structure 20 is formed by doping and is provided between the first surface 10a and the second surface 10b, and includes an N-type doped region 21 adjacent to the first surface 10a, a non-doped intrinsic layer 22, and a P-type doped region 23 adjacent to the second surface 10b. After doping, the N-type doped region 21 may cover an entire area of the first surface 10a while the P-type doped region 23 may cover a part of the second surface 10b. The barrier ring region 30 is disposed in the substrate 10 at a periphery of an upper portion of the substrate 10 and is spaced apart from the P-type doped region 23. An upper surface of the barrier ring region 30 is flush with the second surface 10b. The photosensitive region 40 is located at least above the P-type doped region 23, serving as a light-receiving region of the photodiode 1 to capture incident light. The oxide ring 50 is disposed on the substrate 10 and surrounds the photosensitive region 40. The oxide layer 51 is disposed between the oxide ring 50 and the second surface 10b. The P-type doped region 23 includes a deep doped region 231 and a shallow doped region 232 that are adjacent to each other. The deep doped region 231 and the shallow doped region 232 is aligned with the photosensitive region 40.

The photodiode 1 may further include a first electrode 60 and a second electrode 70. The first electrode 60 is disposed on the substrate 10 away from the P-type doped region 23, and is electrically connected to the N-type doped region 21. As shown in FIG. 1, the N-type doped region 21 and the first electrode 60 are located on different sides of the first surface 10a of the substrate 10. The second electrode 70 is disposed on the deep doped region 231 and in the photosensitive region 40, and is electrically connected to the P-type doped region 23.

The second electrode 70 is made of a metal material. In an exemplary embodiment, the second electrode 70 is an aluminum electrode. The deep doped region 231 has a depth greater than a depth of the shallow doped region 232. In certain embodiments, the depth of the deep doped region 231 is greater than 1.5 μm and the depth of the shallow doped region 232 is smaller than 1 μm. The design of the depth of the deep doped region 231 is to ensure that the metal of second electrode 70 has a sufficient depth for movement at the deep doped region 231. Therefore, the deep doped region 231 may function as an ohmic contact layer.

Referring to FIG. 1, the substrate 10 may be a high-resistance substrate. In some embodiments, the substrate 10 is a high-resistance silicon substrate obtained by different growth methods. The N-type doped region 21 includes a heavily doped region 211 and a lightly doped region 212 disposed in such order in a direction from the first surface 10a to the second surface 10b. The heavily doped region 211 and the lightly doped region 212 are disposed on the non-doped intrinsic layer 22. The lightly doped region 212 is disposed between the heavily doped region 211 and the non-doped intrinsic layer 22. A doping concentration of the heavily doped region 211 is greater than a doping concentration of the lightly doped region 212. The heavily doped region 211 and the lightly doped region 212 have a total depth (H1) being greater than 2 μm. The laminating structure of the heavily doped region 211 and the lightly doped region 212 may enhance stability and detection accuracy of the photodiode 1 at high temperature and reduce the signal-to-noise ratio of the photodiode 1.

The barrier ring region 30 is spaced apart from the P-type doped region 23 by the non-doped intrinsic layer 22. The barrier ring region 30 may be an N-type doped region, so that a PIN junction is formed adjacent to the second surface 10b of the substrate 10 in a lateral or horizontal direction, and the PIN junction thus prevents leakage in the device structure 20.

The photodiode 1 may further include a dielectric layer 80 which is disposed on the second surface 10b and in the photosensitive region 40. The dielectric layer 80 includes a passivation layer 81 and an antireflective layer 82 disposed on the passivation layer 81. The passivation layer 81 has a thickness ranging from 1 nm to 30 nm. The passivation layer 81 contains silicon oxide, aluminum oxide, nickel oxide, or combinations thereof. In certain embodiments, the passivation layer 81 may contain $SiO_2$, $Al_2O_3$, $Ni_2O_5$, combinations thereof, any intermediate thereof, or combinations of the intermediates. The antireflective layer 82 contains silicon nitride, titanium oxide, or combinations thereof. The dielectric layer 80 has an optical thickness being an odd multiple of a quarter of a wavelength of a light to be absorbed by the photodiode 1, which may minimize the reflectivity of the dielectric layer 80 disposed in the photosensitive region 40.

Figure 2:
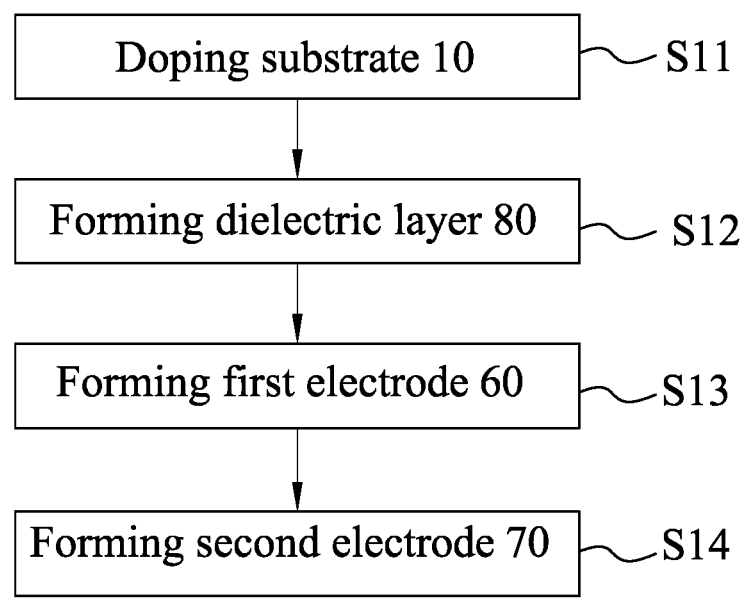
FIG. 2 is a flow chart illustrating a method for manufacturing the photodiode shown in FIG. 1.

FIG. 2 is a flow chart illustrating a method for manufacturing the photodiode 1 shown in FIG. 1. The method for manufacturing the photodiode 1 according to the disclosure are not limited to what is shown in FIG. 2. The method, in the flow chart of FIG. 2, for manufacturing the embodiment of the photodiode 1 shown in FIG. 1 are described below.

The method for manufacturing the photodiode 1 which has the photosensitive region 40 may include steps: providing the substrate 10, doping the substrate 10 (S11), forming the dielectric layer 80 (S12), forming the first electrode 60 (S13), forming the second electrode 70 (S14), and dicing.

The substrate 10 that has the first surface 10a and the second surface 10b opposite to the first surface 10a is provided, and an oxide film is formed on the substrate 10 by a high-temperature oxidation process.

Step S11: Doping the Substrate 10

In the step of doping the substrate 10 (S11), a first portion of the substrate 10, which is adjacent to the second surface 10b, is doped to form the deep doped region 231 and the shallow doped region 232 that are adjacent to each other. Formation of the deep doped region 231 and the shallow doped region 232 is conducted using different concentrations of dopants or different diffusion time period and temperature. Before doping the first portion, a portion of the oxide film is removed by a photolithography process and an etching process to expose the first portion of the substrate 10.

A second portion of the substrate 10, which is adjacent to the second surface 10b and is spaced apart from the first portion, is doped to form the barrier ring region 30. Before doping the second portion, a portion of the oxide film is removed by photolithography process and the etching process to expose the second portion of the substrate 10.

A third portion of the substrate 10, which is adjacent to the first surface 10a, is doped to form the heavily doped region 211 and the lightly doped region 212 that is formed/stacked on the heavily doped region 211. Before doping the third portion, a portion of the oxide film is removed by photolithography process and the etching process to expose the third portion of the substrate 10. The heavily doped region 211 and the lightly doped region 212 cooperatively form the N-type doped region 21. The heavily doped region 211 and the lightly doped region 212 have a total depth (H1) being greater than 2 μm.

Step S12: Forming the Dielectric Layer 80

The dielectric layer 80 is formed on the second surface 10b of the substrate 10, and is corresponding in position to the photosensitive region 40. Before forming the dielectric layer 80 on the second surface 10b of the substrate 10, a portion of an additional oxide film is removed by etching process to expose the second surface 10b of the substrate 10 corresponding in position to the photosensitive region 40. The dielectric layer 80 includes the passivation layer 81 and the antireflective layer 82 disposed on the passivation layer 81.

Step S13: Forming the First Electrode 60

A first metal layer is formed on the first surface 10a of the substrate away from the P-type doped region 23 by, e.g., sputtering, followed by subjecting the first metal layer to an annealing process, so as to form the first electrode 60.

Step S14: Forming the Second Electrode 70

A through hole is formed in the dielectric layer 80 by the photolithography process to expose the deep doped region 231, and a second metal layer is formed on the dielectric layer 80 and in the through hole by, e.g., sputtering, followed by subjecting the second metal layer to the photolithography, etching and annealing processes to form the second electrode 70 in the through hole and on the dielectric layer 80, thereby obtaining the photodiode 1. The second electrode 70 is corresponding in position to the photosensitive region 40 and is connected to the deep doped region 231.

In the embodiment of the method of the present disclosure, when a plurality of photodiodes 1 are formed, a dicing step is conducted to separate the photodiodes 1.

The detailed procedures of the embodiment of the method of the present disclosure are further provided below.

Referring to FIGS. 1 and 2, the substrate 10, which is a high-resistance substrate and has the opposite first and second surfaces 10a and 10b, is provided. The device structure 20 is formed in the substrate 10 by an injection process or a diffusion process. The device structure 20 is provided between the first surface 10a and the second surface 10b, and includes the N-type doped region 21 adjacent to the first surface 10a, the non-doped intrinsic layer 22, and the P-type doped region 23 adjacent to the second surface 10b. The photosensitive region 40 is located at least above the P-type doped region 23, serving as the light-receiving region of the photodiode 1.

The barrier ring region 30 is disposed in the substrate 10 at the periphery of the upper portion of the substrate 10, which may prevent the leakage of the device structure 20 in the substrate 10. The upper surface of the barrier ring region 30 is flush with the second surface 10b. The oxide ring 50 is disposed on the barrier ring region 30 and surrounds the photosensitive region 40. The oxide layer 51 is disposed between the oxide ring 50 and the second surface 10b.

Before doping the substrate 10, the oxide film is formed on the substrate 10 by the high-temperature oxidation process, so that the oxide film may serve as a mask. The aforesaid first portion of the substrate 10 is divided into a deep region and a shallow region. The portion of the oxide film on the deep region of the substrate 10 is removed by the photolithography process and the etching process to expose the deep region of the substrate 10 which is adjacent to the second surface 10b. The deep region of the first portion is doped to form the deep doped region 231. Subsequently, the oxide film formed on the shallow region of the substrate 10 is removed by the photolithography process and the etching process to expose the shallow region of the substrate 10 which is adjacent to the second surface 10b. The shallow region of the first portion is doped to form the shallow doped region 232. A doping concentration of the deep doped region 231 is greater than a doping concentration of the shallow doped region 232 and the deep doped region 231 has the depth greater than the depth of the shallow doped region 232. During forming the deep doped region 231 and the shallow doped region 232, the additional oxide film is formed on the substrate 10.

The oxide film formed on the second portion and the third portion of the substrate 10 is removed by the photolithography process and the etching process to expose the second portion of the substrate 10, which is adjacent to the second surface 10b and is spaced apart from the first portion, and to expose the third portion of the substrate 10, which is adjacent to the first surface 10a. The second portion and the third portion of the substrate 10 are doped to form the barrier ring region 30 and the N-type doped region 21 which includes the heavily doped region 211 and the lightly doped region 212 formed/stacked on the heavily doped region 211. The heavily doped region 211 and the lightly doped region 212 have the total depth (H1) being greater than 2 μm. The barrier ring region 30 is N-type doped. The barrier ring region 30 is spaced apart from the P-type doped region 23 of the device structure 20 by the non-doped intrinsic layer 22, thereby forming the PIN junction adjacent to the second surface 10b of the substrate 10.

The additional oxide film corresponding in position to the photosensitive region 40 is removed by the etching process to expose the second surface 10b of the substrate 10 corresponding in position to the photosensitive region 40. The dielectric layer 80 is formed on the second surface 10b of the substrate 10 by chemical vapor deposition (CVD), atomic layer deposition (ALD), or electron beam evaporation (EB-PVD) and corresponds in position to the photosensitive region 40. The dielectric layer 80 includes the passivation layer 81 located on the second surface 10b of the substrate 10 and the antireflective layer 82 disposed on the passivation layer 81. Each of the passivation layer 81 and the antireflective layer 82 may be a film structure.

The first metal layer is formed on the first surface 10a of the substrate 10 away from the P-type doped region 23 by, e.g., sputtering, followed by subjecting the first metal layer to the annealing process, so as to form the first electrode 60.

The through hole is formed in the dielectric layer 80 by subjecting to the photolithography process to expose the deep doped region 231 of the device structure 20, and the second metal layer is formed on the dielectric layer 80 and in the through hole, followed by subjecting the second metal layer to the photolithography, etching and annealing processes to form the second electrode 70 in the through hole and on the dielectric layer 80, thereby obtaining the photodiode 1. The second electrode 70 is corresponding in position to the photosensitive region 40 and is connected to the deep doped region 231.

After that, in the case that the plurality of photodiodes 1 are formed in the manufacturing method, the dicing step is conducted to separate the photodiodes 1.

In the photodiode 1 and the method for manufacturing the same provided by the disclosure, a short wavelength response of the photodiode 1 may be greater than 90%. The design of the deep doped region 231 and the shallow doped region 232 within the P-type doped region 23 in the device structure 20 of the photodiode 1 may effectively prevent the issue of a reduction in a breakdown voltage resulting from the fusion boding conducted during formation of the second electrode 70 on the P-type doped region 23 of the device structure 20. By virtue of disposing the passivation layer 81 on the second surface 10*b* of the substrate 10 and in the photosensitive region 40, an impact of a surface recombination may be reduced, thereby improving the short wavelength response of the photodiode 1 in multi-band applications. Furthermore, the laminating structure of the heavily doped region 211 and the lightly doped region 212 may enhance the stability and the detection accuracy of the photodiode 1 at high temperature and reduce the signal-to-noise ratio of the photodiode 1.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A photodiode, comprising:
   a substrate that has a first surface and a second surface opposite to said first surface;
   a device structure that is provided between said first surface and said second surface and that includes an N-type doped region adjacent to said first surface, a non-doped intrinsic layer, and a P-type doped region adjacent to said second surface;
   a barrier ring region that is disposed in said substrate at a periphery of an upper portion of said substrate and that is spaced apart from said P-type doped region, an upper surface of said barrier ring region being flush with said second surface;
   a photosensitive region that is located above said P-type doped region;
   an oxide ring that is disposed on said substrate and that surrounds said photosensitive region; and
   an oxide layer that is disposed between said oxide ring and said second surface;
   wherein said P-type doped region includes a deep doped region and a shallow doped region that are adjacent to each other, said deep doped region and said shallow doped region being aligned with said photosensitive region.

2. The photodiode as claimed in claim 1, wherein said deep doped region has a depth greater than a depth of said shallow doped region.

3. The photodiode as claimed in claim 2, wherein said depth of said deep doped region is greater than 1.5 μm, and said depth of said shallow doped region is lower than 1 μm.

4. The photodiode as claimed in claim 1, wherein
   said N-type doped region includes a heavily doped region and a lightly doped region on said non-doped intrinsic layer,
   a doping concentration of said heavily doped region is greater than a doping concentration of said lightly doped region, and
   said heavily doped region and said lightly doped region have a total depth being greater than 2 μm.

5. The photodiode as claimed in claim 4, wherein said lightly doped region is disposed between said heavily doped region and said non-doped intrinsic layer.

6. The photodiode as claimed in claim 1, further comprising
   a first electrode disposed on said substrate away from said P-type doped region, and electrically connected to said N-type doped region, and
   a second electrode disposed on said deep doped region and in said photosensitive region, and electrically connected to said P-type doped region.

7. The photodiode as claimed in claim 1, further comprising a dielectric layer which is disposed on said second surface and in said photosensitive region.

8. The photodiode as claimed in claim 7, wherein said dielectric layer includes a passivation layer and an antireflective layer disposed on said passivation layer.

9. The photodiode as claimed in claim 8, wherein said passivation layer has a thickness ranging from 1 nm to 30 nm.

10. The photodiode as claimed in claim 8, wherein said passivation layer contains silicon oxide, aluminum oxide, nickel oxide, or combinations thereof.

11. The photodiode as claimed in claim 8, wherein said antireflective layer contains silicon nitride, titanium oxide, or combinations thereof.

12. The photodiode as claimed in claim 7, wherein said dielectric layer has an optical thickness being an odd multiple of a quarter of a wavelength of a light to be absorbed by said photodiode.

* * * * *